United States Patent
Williams et al.

(10) Patent No.: US 9,082,722 B2
(45) Date of Patent: Jul. 14, 2015

(54) MONOLITHIC INTEGRATED CIRCUIT (MMIC) STRUCTURE AND METHOD FOR FORMING SUCH STRUCTURE

(71) Applicant: Raytheon Company, Waltham, MA (US)

(72) Inventors: Adrian D. Williams, Methuen, MA (US); Paul M. Alcorn, Groton, MA (US)

(73) Assignee: RAYTHEON COMPANY, Waltham, MA (US)

( * ) Notice: Subject to any disclaimer, the term of this patent is extended or adjusted under 35 U.S.C. 154(b) by 25 days.

(21) Appl. No.: 13/849,858

(22) Filed: Mar. 25, 2013

(65) Prior Publication Data

US 2014/0284661 A1    Sep. 25, 2014

(51) Int. Cl.
| | | |
|---|---|---|
| H01L 21/311 | (2006.01) | |
| H01L 29/66 | (2006.01) | |
| H01L 29/812 | (2006.01) | |
| H01L 21/8252 | (2006.01) | |
| H01L 29/778 | (2006.01) | |
| H01L 27/06 | (2006.01) | |
| H01L 23/29 | (2006.01) | |
| H01L 23/31 | (2006.01) | |
| H01L 29/20 | (2006.01) | |

(52) U.S. Cl.
CPC ...... *H01L 21/31144* (2013.01); *H01L 21/8252* (2013.01); *H01L 27/0605* (2013.01); *H01L 29/66462* (2013.01); *H01L 29/66863* (2013.01); *H01L 29/7786* (2013.01); *H01L 29/812* (2013.01); *H01L 23/291* (2013.01); *H01L 23/3171* (2013.01); *H01L 27/0629* (2013.01); *H01L 29/2003* (2013.01)

(58) Field of Classification Search
None
See application file for complete search history.

(56) References Cited

U.S. PATENT DOCUMENTS

| | | | |
|---|---|---|---|
| 2001/0012652 A1 | 8/2001 | Matsuda | |
| 2006/0006415 A1* | 1/2006 | Wu et al. | 257/194 |
| 2008/0280400 A1 | 11/2008 | Aihara | |
| 2014/0061659 A1* | 3/2014 | Teplik et al. | 257/76 |

OTHER PUBLICATIONS

Notification of Transmittal of the International Search Report and the Written Opinion of the International Searching Authority, or the Declaration, PCT/US2014/019860, Jun. 3, 2014, 1 page.
International Search Report, PCT/US2014/019860, dated Jun. 3, 2014, 4 pages.
Written Opinion of the International Searching Authority, PCT/US2014/019860, dated Jun. 3, 2014, 6 pages.

* cited by examiner

*Primary Examiner* — Tan N Tran
*Assistant Examiner* — Scott R Wilson
(74) *Attorney, Agent, or Firm* — Daly, Crowley, Mofford & Durkee, LLP

(57) ABSTRACT

A method for forming a semiconductor structure having a transistor device with a control electrode for controlling a flow of carriers between a first electrode and a second electrode. A passivation layer is deposited over the first electrode, the second electrode and the control electrode. An etch stop layer is deposited on the passivation layer over the control electrode. A dielectric layer is formed over the etch stop layer. A window is etched through a selected region in the dielectric layer over the control electrode, to expose a portion of the etch stop layer disposed over the control electrode. A metal layer is formed on a portion of the etch stop layer and the dielectric layer is also formed on the metal layer. A second metal layer is deposited on the portion of the dielectric layer formed on the first mentioned metal layer.

5 Claims, 7 Drawing Sheets

MONOLITHIC INTEGRATED CIRCUIT (MMIC) STRUCTURE AND METHOD FOR FORMING SUCH STRUCTURE

TECHNICAL FIELD

This disclosure relates generally to a Monolithic Integrated Circuit (MMIC) Structure and to a method for selectively etching a dielectric layer using an underling etch stop layer to protect an underling active device passivation layer.

BACKGROUND

As is known in the art, as monolithic microwave integrated circuits (MMICs) are designed to operate at ever higher frequencies, the effects of dielectric loading on various MMIC conduction paths (including gates and transmission lines) becomes more pronounced. The minimization of such loading is critical to achieving the desired gain performance.

As is also known in the art, plasma enhanced chemical vapor deposition (PECVD) is widely used for the deposition of silicon nitride, which may act as a passivation layer to passivate components, or act as a capacitor dielectric. This deposition technique however, coats regions of the MMIC where the presence of additional dielectric is not desired and adversely impacts device performance at the higher frequencies.

SUMMARY

In accordance with the present disclosure, a method is provided for forming a semiconductor structure. The method includes: providing a semiconductor layer with a transistor device having a control electrode for controlling a flow of carriers between a first electrode and a second electrode; depositing a passivation layer over the first electrode, the second electrode and the control electrode; depositing an etch stop layer on the passivation layer, such etch stop layer being disposed over the control electrode; forming a dielectric layer over the etch stop layer; and etching a window through a selected region in the dielectric layer over the control electrode, to expose a portion of the etch stop layer disposed over the control electrode.

In one embodiment, the method includes: forming a metal layer on a portion of the etch stop layer; wherein the dielectric layer is also formed on the metal layer; and In one embodiment, the method includes depositing a second metal layer on the portion of the dielectric layer formed on the first mentioned metal layer.

In one embodiment, the transistor device is a field effect transistor.

In one embodiment, the semiconductor layer is a III-V semiconductor material.

In one embodiment, the passivation layer is silicon nitride.
In one embodiment, the etch stop layer is aluminum oxide.
In one embodiment, the dielectric layer is silicon nitride.
In one embodiment, the dielectric layer is Plasma Enhanced Chemical Vapor Deposited (PECVD) silicon nitride.

In one embodiment, the etch stop layer is an atomic layer deposited (ALD) layer.

In one embodiment the etching comprises using reactive ion etching (RIE) or inductively coupled plasma etching (ICP) and photoresist patterning.

In one embodiment, the etching uses sulfur hexafluoride based plasma etchants.

With such method, the use of PECVD silicon nitride enables the blanket-coating of MMIC wafers for passivation or as the dielectric of a capacitor with the subsequent ability to remove it from areas where it is undesirable. PECVD processes are typically not compatible with photoresist patterning processes due to the high temperatures (250 Celsius or higher) involved, so this method creates an alternative path by using an etch stop layer for the selective placement of the dielectric layer on MMIC structures.

Further, the use of aluminum oxide as an etch-stop interlayer enables selective removal of the silicon nitride dielectric layer from areas on a MMIC where its presence is undesirable by here using reactive ion etching (RIE) or inductively coupled plasma etching (ICP) techniques with standard photoresist patterning techniques and sulfur hexafluoride based plasma etchants.

With such method, a thin ALD aluminum oxide etch stop layer is used along with photo patterning to selectively remove PECVD silicon nitride from unwanted areas on the upper surface of the MMIC structure. The etch-stop layer provides precision control over residual passivation thickness with dry etch selectivity in excess of 100:1; the method enables the use of PECVD silicon nitride for capacitor structures; the method enables etch selectivity in excess of 100:1 with an RIE etch of PECVD of silicon nitride to ALD aluminum oxide; the process can be used to protect fragile gate structures; and the method can be used for GaAs, GaN, and other semiconductor material.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
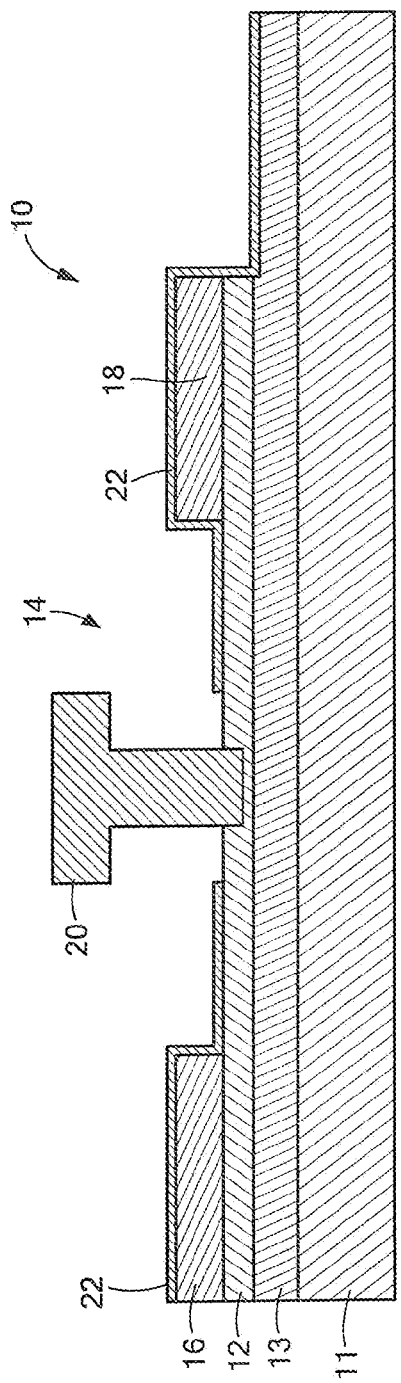
FIGS. 1A-1L are simplified, cross sectional diagrams of an MMIC at various steps in the fabrication thereof in accordance with the disclosure.

Referring now to FIG. 1A, a semiconductor structure 10 is shown having a substrate 11, here for example silicon carbide with a GaN semiconductor layer 13 thereon and a additional semiconductor layer 12 on semiconductor layer 13, layer 12 is here for example, a III-V semiconductor layer such as for example, here AlGaN. It should be understood that other semiconductors such GaAs, InP, for example, may be used on the suitable substrate. The semiconductor layer 12 has a transistor device, 14, here for example a field effect transistor (FET) device formed therein using any conventional processing to provide source and drain electrodes 16, 18, respectively as shown, in ohmic contact with the semiconductor layer 12 and a gate electrode 20 in Schottky contact with the semiconductor layer 12 and a passivation layer 22, here disposed over the source and drain electrodes 16 and 18, and a portion of the semiconductor 12 as shown. Here for example the passivation layer 22 is silicon nitride. The gate electrode 20 controls the flow of carriers in the semiconductors layers 12, 13 between the source and drain electrodes.

Figure 1B:
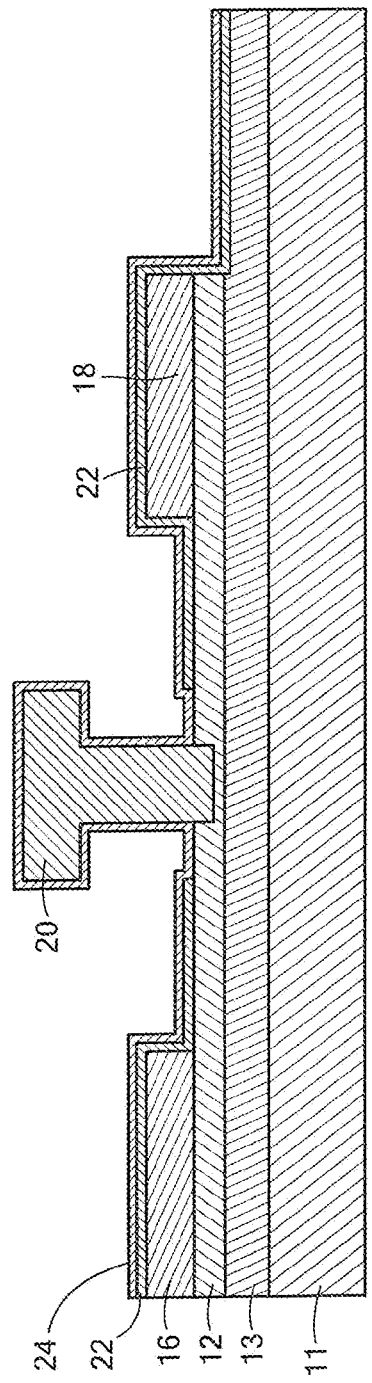

Next, referring to FIG. 1B, an additional layer 24 of silicon nitride is uniformly deposited over the entire structure shown in FIG. 1A, here, for example, a 200 Angstrom thick layer 24 of PECVD silicon nitride to provide gate 20 passivation.

Figure 1C:
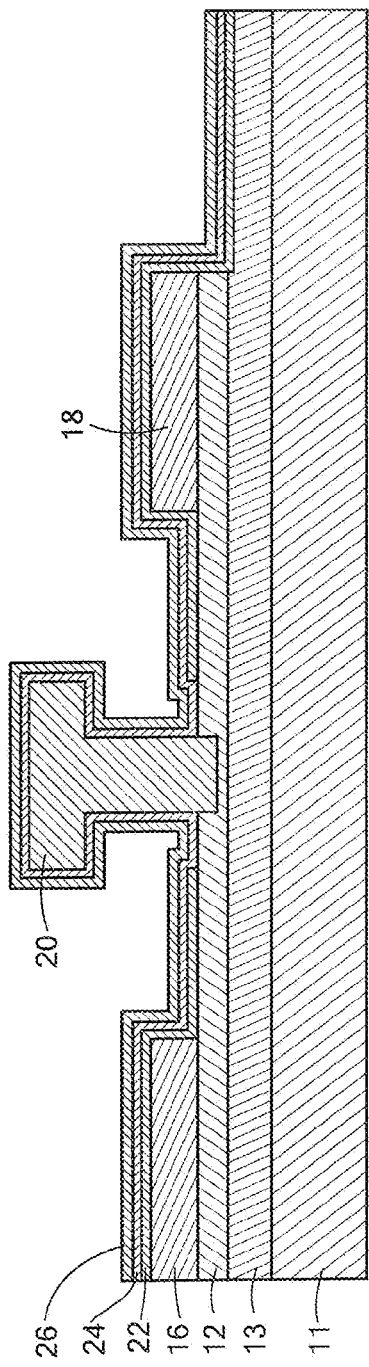

Next, referring to FIG. 1C, an etch stop layer 26 is uniformly disposed on the passivation layer 24, here for example, a 25 Angstrom thin layer of Atomic Layer Deposited (ALD) layer of aluminum oxide.

Figure 1D:
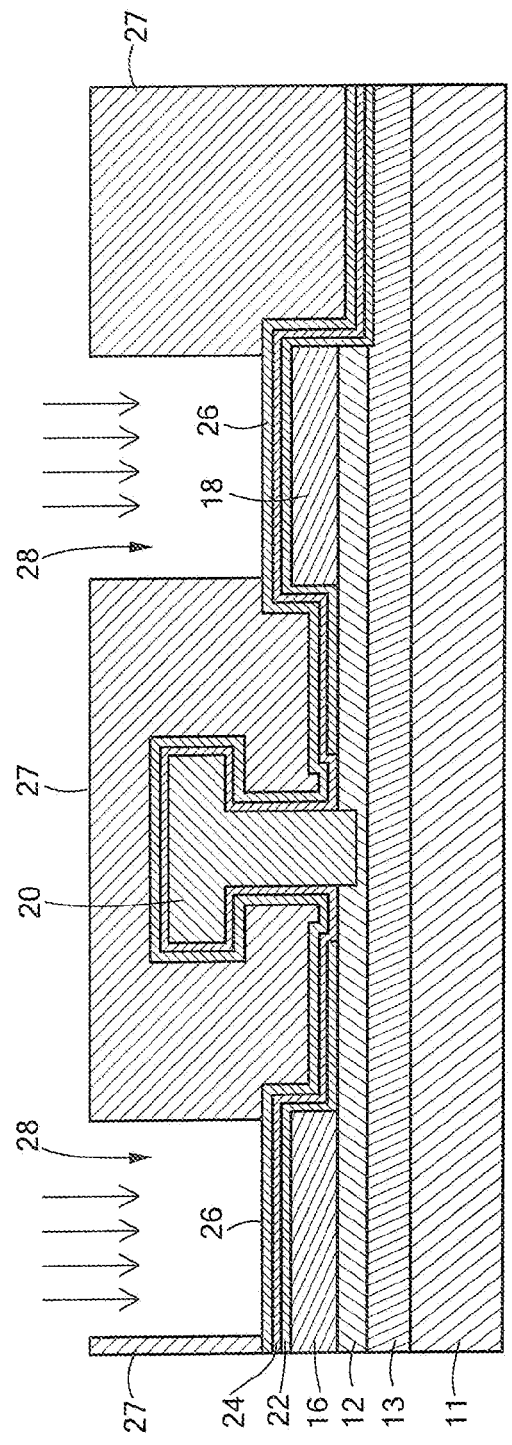
Figure 1E:
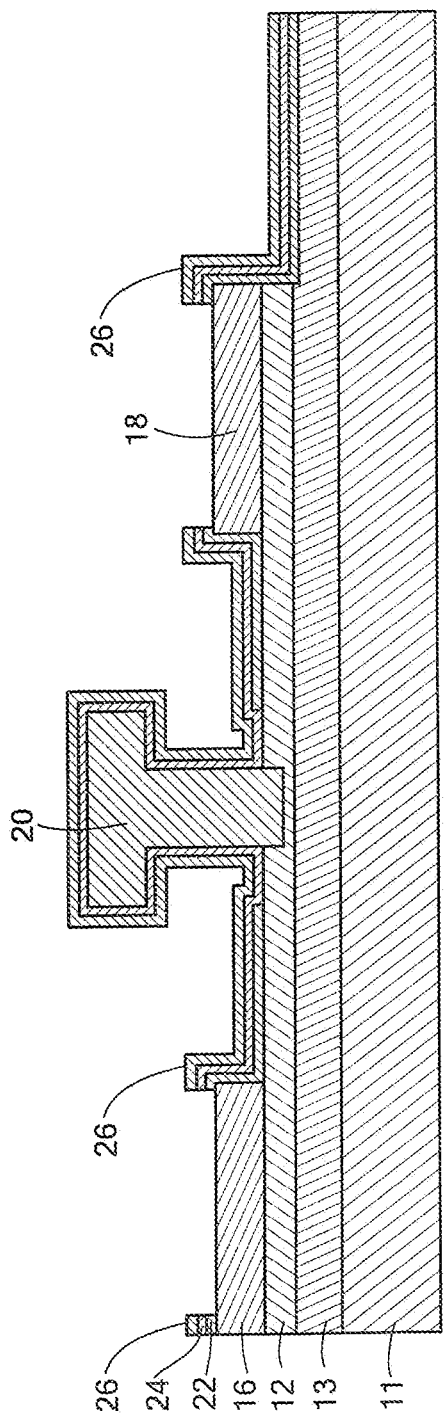

Next, referring to FIG. 1D, first level active device metallization processing begins by first forming a layer 27 of photoresist patterned as shown to have formed there-through windows 28 to expose portions of the etch-stop layer 26 and passivation layers 22 and 24 over the source and drain electrodes 18 while covering the other portions of the etch-stop layer 26 including the portion of the etch-stop layer 26 over the gate electrode 20, as shown. It is noted that the gate electrode 20 terminates in a conductive gate pad, not shown, (out of the plane shown in FIG. 1D) and this conductive gate pad is also exposed by the windows 28 in the photoresist layer 27. The structure with the windowed photoresist layer 27, as shown, is subjected to a dry, for example, plasma, or wet etch, to remove, in a first step, portions of the etch-stop layer 26 exposed by the windows 28 and then, in a second step, remove the portions of the underlying silicon nitride passivation layers 24 and 22 thereby exposing the source and drain electrodes 16 and 18 as well as the not shown, out of plane gate contact pad. The photoresist layer is then stripped leaving the structure shown in FIG. 1E.

Figure 1F:
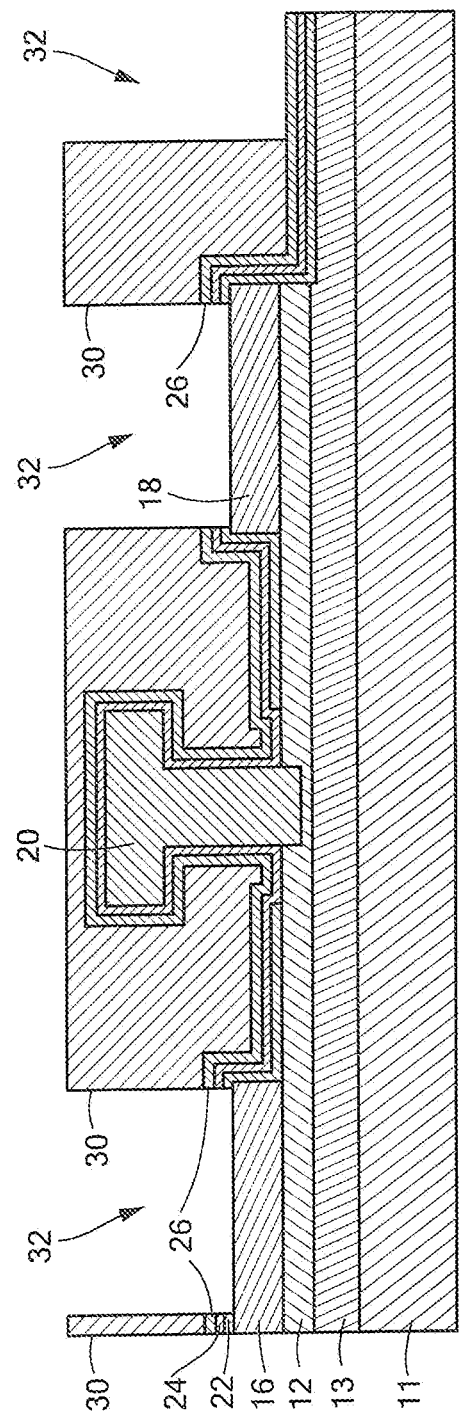

Next, referring to FIG. 1F, a photoresist layer 30 is deposited and lithographically processed to have windows 32 formed therein to expose regions where a first level (level 1) metallization is to be formed. This level 1 metallization with be used to form interconnects for the source and drain electrodes 24, 26, the gate contact pad (not shown and referred to above) as well as bottom electrodes for capacitors, to be described, and microwave transmission lines and coplanar ground plane structures of the MMIC to be formed.

Figure 1G:
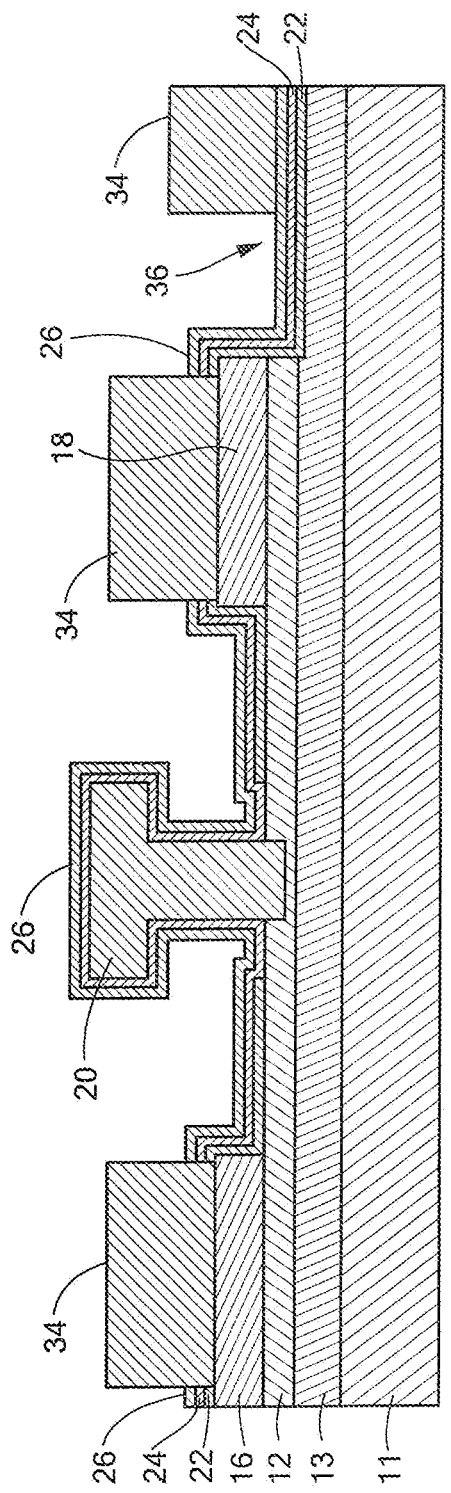

Referring now also to FIG. 1G, metal 34 is deposited on the photoresist layer 32 (FIG. 1F) and through the windows 32 therein onto the aforementioned exposed the source and drain electrodes 16, 18, on the aforementioned gate contact pad (not) shown as well as other portions here for example a portion 36 of the etch stop layer 26 where a capacitor is to be formed. The photoresist layer 30 (FIG. 1F) is then stripped from the surface along with any metal 34 thereon resulting in the metal thereon being lifted off the structure resulting in the structure shown in FIG. 1G.

Figure 1H:
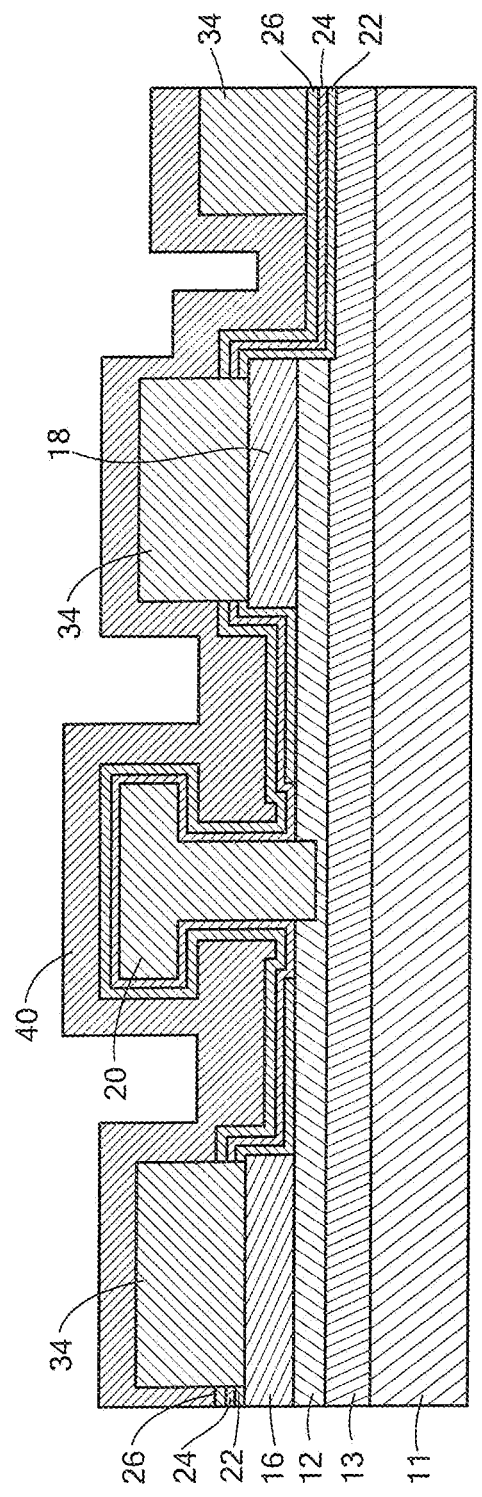

Next, a dielectric layer 40, here for example, PECVD Plasma Enhanced Chemical Vapor Deposited (PECVD) silicon nitride, is coated over the surface of the structure shown in FIG. 1G resulting in the structure shown in FIG. 1H.

Figure 1I:
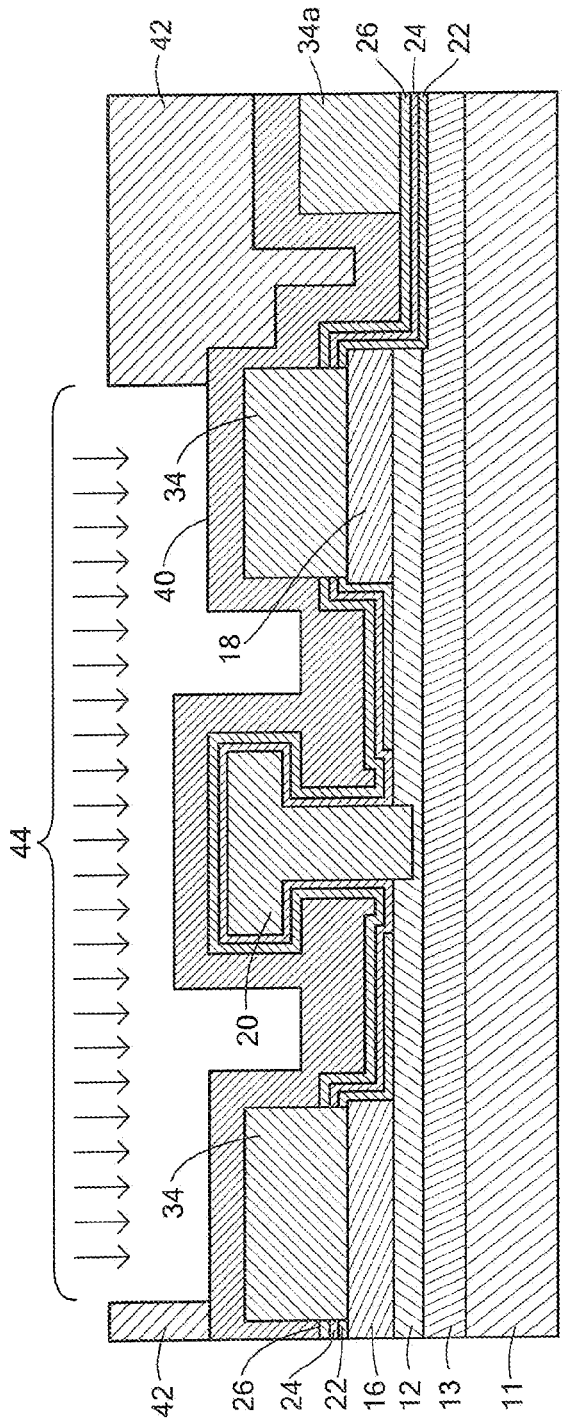
Figure 1J:
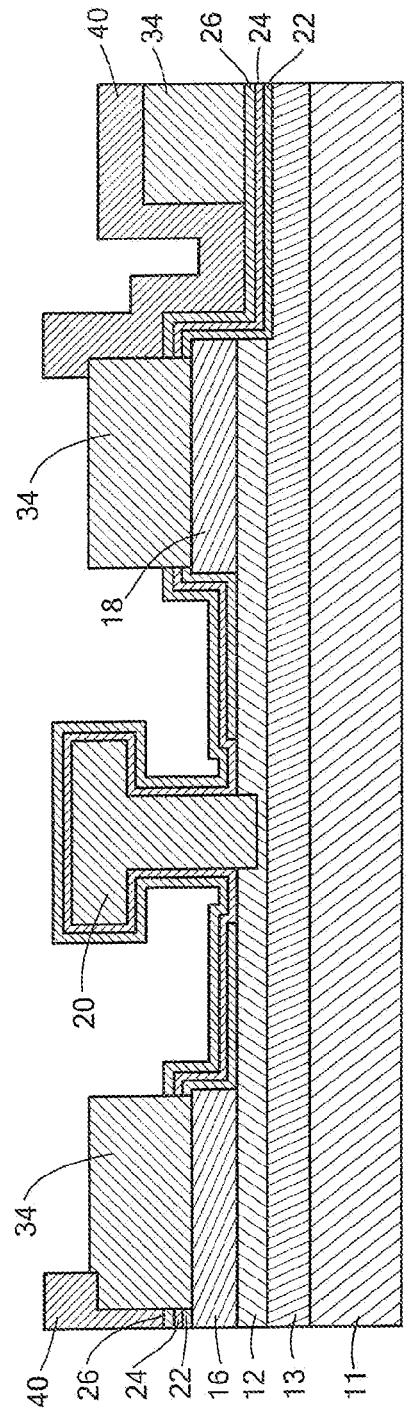

Next, a photoresist layer 42 is deposited and photolithographically processed to have a window 44 formed therein, as shown in FIG. 1I, with the photoresist layer 42 remaining over the metal 34 being used to provide a bottom plate 34a for a capacitor to be formed. The structure is exposed to a dry etch, such as for example, a plasma etch such as reactive ion etching (RIE) or inductively coupled plasma etching (ICP), sulfur hexafluoride based plasma etchants), or a wet etch. It is noted that the etch process etches away the silicon nitride at a rate significantly greater than that to the aluminum oxide, here for example 100 times greater; thus the aluminum oxide layer 26 is considered as etch stop layer since the etching stops at the aluminum oxide layer 26, as indicated in FIG. 1J after removal of the photoresist layer 42. (It is noted that the metal 34 of the source and drain electrodes as well as the gate conductor pad (not shown) referred to above exposed by the window also acts as an etch stop).

Figure 1K:
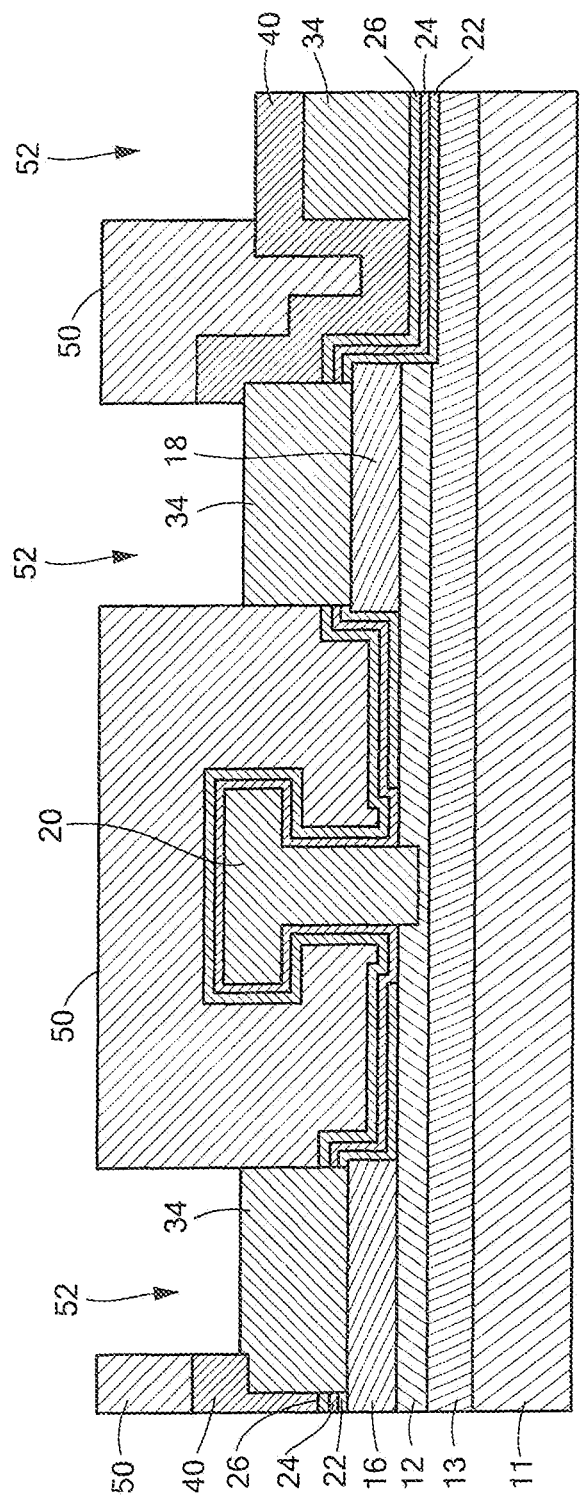
Figure 1L:
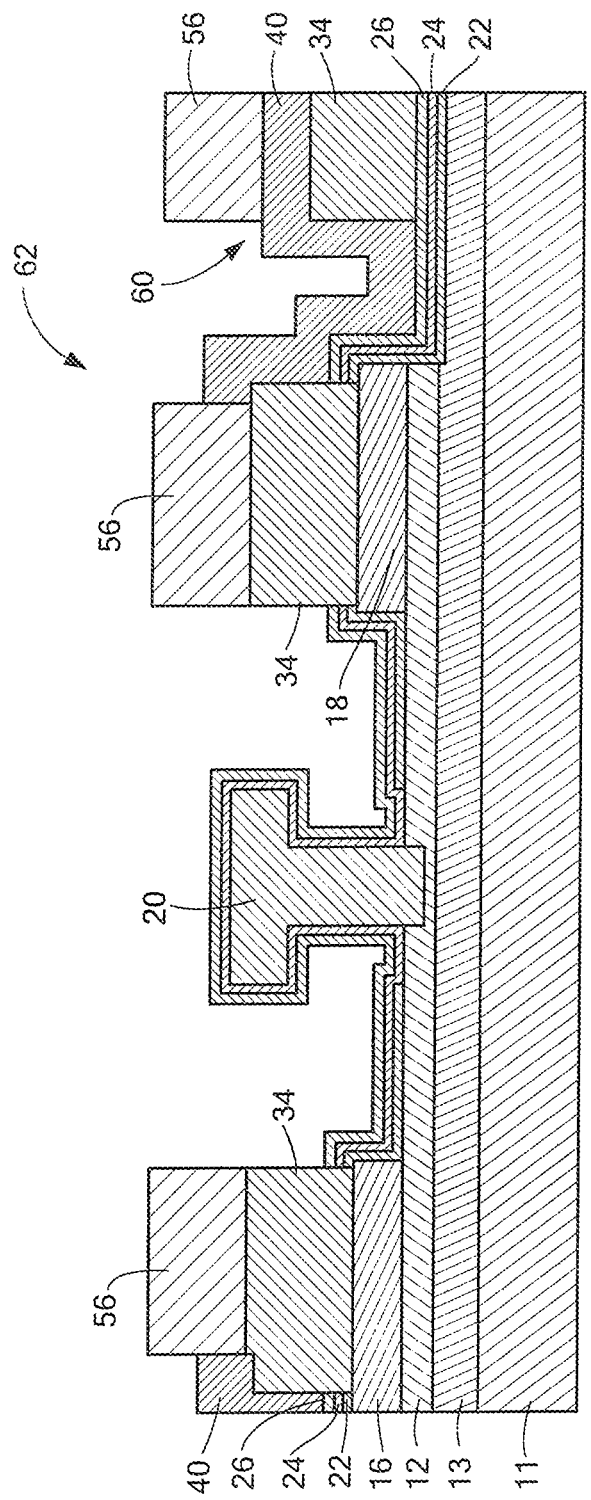

Next, the second level (level 2) metallization process begins by depositing a photoresist layer 50 and patterning the photoresist layer 50 lithographically to have windows 52 formed there-through, as shown in FIG. 1K. The windows 52 exposed the metal 34 used for the source and drain electrode 16, 18, the gate conductor pad (not shown and described above) and the portion of the silicon nitride dielectric layer 40 to be used for the capacitor being formed. Next metal 56 is deposited on the remaining portions of the photoresist layer 50 and on the metal 34 used on the source and drain electrodes 16, 18 the gate conductor pad (not shown and described above) and the portion of the silicon nitride dielectric layer 40 to be used for the capacitor being formed. Next, the photoresist layer 50 (FIG. 1K) is stripped with the portions of the metal 56 thereon being lifted off the structure while the remaining portions of the metal 56 remain on the first-level metal 34 disposed on source and drain electrode metal 16, 18, the gate conductor pad (not shown and described above) and the portion of the silicon nitride dielectric disposed on first-level metal 34, thereby completing the formation of the capacitor 60 of the MMIC 62.

A number of embodiments of the disclosure have been described. Nevertheless, it will be understood that various modifications may be made without departing from the spirit and scope of the disclosure. For example, the method may be used with bipolar transistors. Accordingly, other embodiments are within the scope of the following claims.

What is claimed is:

1. A semiconductor structure, comprising;
 a III-V semiconductor layer;
 source and drain electrodes in ohmic contact with the semiconductor layer;
 a gate electrode in Schottky contact with the semiconductor layer;
 a passivation layer disposed over the entire gate electrode;
 an etch stop layer disposed on the passivation layer;
 a dielectric layer disposed on a first portion of the etch stop layer, the dielectric layer having a window therein, such window exposing entirely a second portion of the etch stop layer, the second, exposed portion of the etch stop layer being disposed over the entire gate electrode;
 wherein the passivation layer has portions extending from the gate electrode to the source and drain electrodes, wherein the etch stop layer has portions extending from the gate electrode to the source and drain electrodes, and wherein the window in the dielectric layer exposes portions of the source and drain electrodes and entirely exposes the portions of the etch stop layer extending from the gate electrode to the source and drain electrodes.

2. The semiconductor structure recited in claim 1 wherein the dielectric layer and passivation layers are Plasma Enhanced Chemical Vapor Deposited (PECVD) silicon nitride and the etch stop layer is aluminum oxide.

3. The semiconductor structure recited in claim 2 wherein the aluminum oxide is deposited atomic layer deposition (ALD) aluminum oxide having a thickness of less than 100 Angstroms.

4. The semiconductor structure recited in claim 1 including:
 a first metal disposed on a capacitor region portion of the etch stop layer;
 a second metal disposed on a capacitor region portion of the dielectric layer, the capacitor region portion of the dielectric layer being disposed over the capacitor region portion of the etch stop layer and over the first metal to provide a capacitor.

5. The semiconductor structure recited in claim 4 wherein the dielectric layer and the passivation layer are Plasma Enhanced Chemical Vapor Deposited (PECVD) silicon nitride and the etch stop layer is aluminum oxide.

* * * * *